United States Patent
Kotsugai et al.

(10) Patent No.: US 11,521,879 B2
(45) Date of Patent: Dec. 6, 2022

(54) LOAD PORT APPARATUS, SEMICONDUCTOR MANUFACTURING APPARATUS, AND METHOD OF CONTROLLING ATMOSPHERE IN POD

(71) Applicant: TDK CORPORATION, Tokyo (JP)

(72) Inventors: Tatsuhiro Kotsugai, Tokyo (JP); Toshihiko Miyajima, Tokyo (JP); Takeshi Kagaya, Tokyo (JP)

(73) Assignee: TDK CORPORATION, Tokyo (JP)

( * ) Notice: Subject to any disclaimer, the term of this patent is extended or adjusted under 35 U.S.C. 154(b) by 387 days.

(21) Appl. No.: 16/524,640

(22) Filed: Jul. 29, 2019

(65) Prior Publication Data

US 2020/0035530 A1 Jan. 30, 2020

(30) Foreign Application Priority Data

Jul. 30, 2018 (JP) .............................. JP2018-142818

(51) Int. Cl.
*H01L 21/673* (2006.01)
*B08B 17/02* (2006.01)
*H01L 21/677* (2006.01)

(52) U.S. Cl.
CPC ........ *H01L 21/67389* (2013.01); *B08B 17/02* (2013.01); *H01L 21/67772* (2013.01)

(58) Field of Classification Search
CPC ......... H01L 21/67772; H01L 21/67775; H01L 21/67389; B08B 17/02
See application file for complete search history.

(56) References Cited

U.S. PATENT DOCUMENTS

| | | | |
|---|---|---|---|
| 2002/0023458 A1* | 2/2002 | Sakata | H01L 21/67379 62/378 |
| 2003/0031537 A1* | 2/2003 | Tokunaga | H01L 21/67772 414/217 |
| 2009/0092468 A1 | 4/2009 | Oyama et al. | |
| 2012/0237323 A1 | 9/2012 | Sugawara | |
| 2014/0363258 A1 | 12/2014 | Iwamoto et al. | |
| 2016/0293454 A1* | 10/2016 | Hiroki | H01J 37/3244 |
| 2017/0170042 A1* | 6/2017 | Okabe | H01L 21/67017 |
| 2018/0161830 A1* | 6/2018 | Sasaki | H01L 21/67775 |

(Continued)

FOREIGN PATENT DOCUMENTS

| | | |
|---|---|---|
| JP | 2000-188320 A | 7/2000 |
| JP | 2003-45933 A | 2/2003 |

(Continued)

*Primary Examiner* — Glenn F Myers
(74) *Attorney, Agent, or Firm* — Oliff PLC

(57) ABSTRACT

Provided is a load port apparatus including: a mounting unit on which a pod housing a housed object is mounted; a frame portion provided to stand adjacent to the mounting unit and having a frame opening to which a main opening of the pod is connected; a door engageable with a lid for the main opening of the pod for opening and closing the frame opening and the main opening; a door drive mechanism which drives the door; an inner gas exhaust unit provided below an inner side of the frame opening to exhaust a gas from an inside of a mini environment connected to the pod through the main opening and the frame opening; and a corrosive gas detection sensor arranged between the frame opening and the inner gas exhaust unit or in an exhaust flow path of the inner gas exhaust unit.

2 Claims, 6 Drawing Sheets

(56) References Cited

U.S. PATENT DOCUMENTS

2019/0267258 A1* 8/2019 Rice .................. H01L 21/67769
2020/0227295 A1* 7/2020 Murata ............. H01L 21/67253

FOREIGN PATENT DOCUMENTS

| JP | 2006-286682 | A  | 10/2006 |
|----|-------------|----|---------|
| JP | 2006-351868 | A  | 12/2006 |
| JP | 2009-088437 | A  | 4/2009  |
| JP | 2012-195438 | A  | 10/2012 |
| JP | 2013-120760 | A  | 6/2013  |
| JP | 6198043     | B2 | 9/2017  |
| JP | 2018-041937 | A  | 3/2018  |
| KR | 2008-0032963| A  | 4/2008  |
| KR | 010-1452341 | B1 | 10/2014 |

* cited by examiner

LOAD PORT APPARATUS, SEMICONDUCTOR MANUFACTURING APPARATUS, AND METHOD OF CONTROLLING ATMOSPHERE IN POD

BACKGROUND OF THE INVENTION

1. Field of the Invention

The present invention relates to a load port apparatus and the like on which a pod can be mounted.

2. Description of the Related Art

In a semiconductor manufacturing process, a pod is mounted on a mounting table of a load port apparatus, and a housed object such as a semiconductor wafer is transferred to an equipment front end module (EFEM) or a processing chamber. In addition, the housed object subjected to the predetermined processing in the processing chamber is accommodated again in the pod through the EFEM. In addition, in the pod, in order to prevent the oxidation and the like of the housed object during the storage, a technology has been proposed in which a cleaning gas such as an inert gas is introduced from the load port apparatus. Furthermore, in order to realize efficient, safe pod cleaning, a technology has been proposed in which an exhaust unit for recovering an excess gas is provided (refer to JP 6198043 B2).

On the other hand, in some cases, in the pod, the concentration of corrosive gases such as chlorine, bromine, fluorine, ammonia, or ions thereof which are different from oxygen is increased, and due to such a corrosive gas, the quality of the housed object inside the pod may be lower, or electronic components around the pod may be damaged. It is considered that the corrosive gas in the pod may flow in from the processing chamber through the EFEM or may be generated from the housed object after the processing. Even if the amount of these corrosive gases is very small in comparison with oxygen, the corrosive gases may affect the housed object or the like, and in some cases, there is a problem in that the corrosive gases may not be able to be removed efficiently in the process of introducing the cleaning gas in the related art (refer to JP 2003-45933 A).

SUMMARY OF THE INVENTION

The invention has been considered in the above situation, and an object is to provide a load port apparatus capable of preventing a housed object and peripheral devices from being damaged by a corrosive gas in a pod or flowing out from the pod.

According to a first aspect of the invention, there is provided a load port apparatus including: a mounting unit on which a pod housing a housed object is mounted; a frame portion provided to stand adjacent to the mounting unit and having a frame opening to which a main opening of the pod is connected; a door engageable with a lid for the main opening of the pod for opening and closing the frame opening and the main opening; a door drive mechanism which drives the door; an inner gas exhaust unit provided below an inner side of the frame opening to exhaust a gas from an inside of a mini environment connected to the pod through the main opening and the frame opening; and a corrosive gas detection sensor arranged between the frame opening and the inner gas exhaust unit or in an exhaust flow path of the inner gas exhaust unit.

In the first aspect of the invention, the load port apparatus may include a corrosive gas detection sensor arranged at an appropriate position to detect or estimate a corrosive gas concentration in the pod. That is, the corrosive gas detection sensor arranged close to the frame opening can substantially detect the corrosive gas concentration of the gas in the pod by detecting the gas extracted from the inside of the pod. In addition, even if the corrosive gas detection sensor is not close to the frame opening, the corrosive gas concentration of the gas in the pod can be estimated from the detection result of the corrosive gas detection sensor arranged between the frame opening and the inner gas exhaust unit or in the flow path of the inner gas exhaust unit. Therefore, such a load port apparatus can prevent the housed object and peripheral devices from being damaged by the corrosive gas by performing a cleaning process or the like according to the detection result of the corrosive gas concentration in the pod.

In addition, for example, the corrosive gas detection sensor may be attached to the door.

In a state where the pod is connected to the mini environment through the main opening and the frame opening, the door is moved to the position that is close to the frame opening and does not disturb the transport of the housed object. Therefore, in the load port apparatus, the corrosive gas detection sensor is arranged at the door, so that it is possible to appropriately measure the corrosive gas concentration measured by the corrosive gas detection sensor. In addition, the corrosive gas detection sensor is provided to the door itself, and it is possible to avoid the problem in that the door moving around the frame opening interferes with the corrosive gas detection sensor.

In addition, for example, according to a second aspect of the invention, there is provided is a load port apparatus including: a mounting unit on which a pod housing a housed object is mounted; a frame portion provided to stand adjacent to the mounting unit and having a frame opening to which a main opening of the pod is connected; a door engageable with a lid for the main opening of the pod for opening and closing the frame opening and the main opening; a door drive mechanism which drives the door; and a corrosive gas detection sensor arranged in a first space positioned below the pod and above the mounting unit or a second space surrounding an outer periphery of an outer side of the frame opening.

In the second aspect of the invention, the load port apparatus may include a corrosive gas detection sensor arranged at an appropriate position to detect a corrosive gas flowing out from the pod. That is, since the corrosive gas detection sensor arranged in the first space around the mounting table or in the second space around the connection portion between the frame opening and the main opening of the pod can appropriately detect the corrosive gas flowing out from the pod to the outside, by performing a cleaning process according to the detection result of the corrosive gas concentration in the pod, the corrosive gas can be prevented from flowing out from the pod, so that it is possible to prevent peripheral devices and the like from being damaged by the corrosive gas. In addition, since the outflow of the corrosive gas from the pod is also related to the corrosive gas concentration in the pod, the corrosive gas concentration in the pod is prevented from being excessively increased, and thus, it is possible to prevent housed object from being damaged by the corrosive gas.

In addition, for example, in the second aspect, the load port apparatus may include an outer gas exhaust unit which exhausts gas of at least one of the first space and the second space.

Such a load port apparatus suppresses the diffusion of the gas flowing out from the pod and exhausts the corrosive gas and the like flowing out from the pod, and thus, it is possible to prevent the peripheral devices and the like from being damaged by the corrosive gas flowing out from the pod.

In addition, for example, according to the third aspect of the invention, there is provided a load port apparatus: a mounting unit on which a pod housing a housed object is mounted; a frame portion provided to stand adjacent to the mounting unit and having a frame opening to which a main opening for the main opening of the pod is connected; a door engageable with a lid of the pod for opening and closing the frame opening and the main opening; a door drive mechanism which drives the door; a bottom purge extraction nozzle connected to a bottom hole of the pod to discharge a gas from an inside of the pod; and a corrosive gas detection sensor provided in an exhaust flow path of the bottom purge extraction nozzle.

In the load port apparatus according to the third aspect of the invention, the corrosive gas detection sensor provided in the exhaust flow path of the bottom purge extraction nozzle can detect the corrosive gas concentration of the gas in the pod. Therefore, by performing the cleaning process or the like according to the detection result of the corrosive gas concentration in the pod, such a load port apparatus can prevent the housed object and peripheral devices from being damaged by the corrosive gas.

In addition, for example, in the first to third aspects of the invention, the load port apparatus may include a front purge nozzle provided independently from the door and to introduce a cleaning gas into the pod through the main opening and the frame opening from an inside of the mini environment to which the pod is connected through the main opening and the frame opening.

In addition, for example, in the first to third aspects of the invention, the load port apparatus may include a bottom purge introduction nozzle which is connected to the bottom hole of the pod to introduce a cleaning gas into the pod.

Such a load port apparatus can appropriately and efficiently perform a cleaning process on the pod according to the corrosive gas concentration and the like in the pod detected by the corrosive gas detection sensor.

In addition, for example, in the first to third aspects of the invention, the load port apparatus may include a control unit receiving information on a corrosive gas concentration, which is a detection result of the corrosive gas detection sensor to control the door drive mechanism.

After confirming that the concentration of the corrosive gas is lower than a predetermined value, the control unit may close the main opening and the frame opening.

In addition, a method of controlling an atmosphere in a pod according to the invention is a method of controlling an atmosphere in a pod by a load port apparatus having such a control unit, the method including: detecting a corrosive gas concentration by the corrosive gas detection sensor in a state where the pod is connected to the mini environment through the main opening and the frame opening; and controlling the door drive mechanism by the control unit to close the main opening and the frame opening in a case where it is detected that the corrosive gas concentration is lower than a predetermined value.

In the load port apparatus and the method of controlling the atmosphere in the pod, the pod can be sealed in a state where the corrosive gas concentration is high, and thus, it is possible to prevent the problem in that the housed object is damaged by the corrosive gas in the pod.

In addition, according to the invention, there is provided a semiconductor manufacturing apparatus including: any one of the load port apparatuses described above; an EFEM which is provided with the load port apparatus and in which a mini environment to which the pod is connected through the main opening and the frame opening is formed; and a processing apparatus main body which is connected to the EFEM and includes a processing chamber for processing the housed object in the pod transported through the mini-environment.

By performing the cleaning process or the like according to the detection result of the corrosive gas concentration in the pod, such a semiconductor manufacturing apparatus can prevent the housed object and peripheral devices from being damaged by the corrosive gas.

DETAILED DESCRIPTION OF THE PREFERRED EMBODIMENTS

Figure 1:
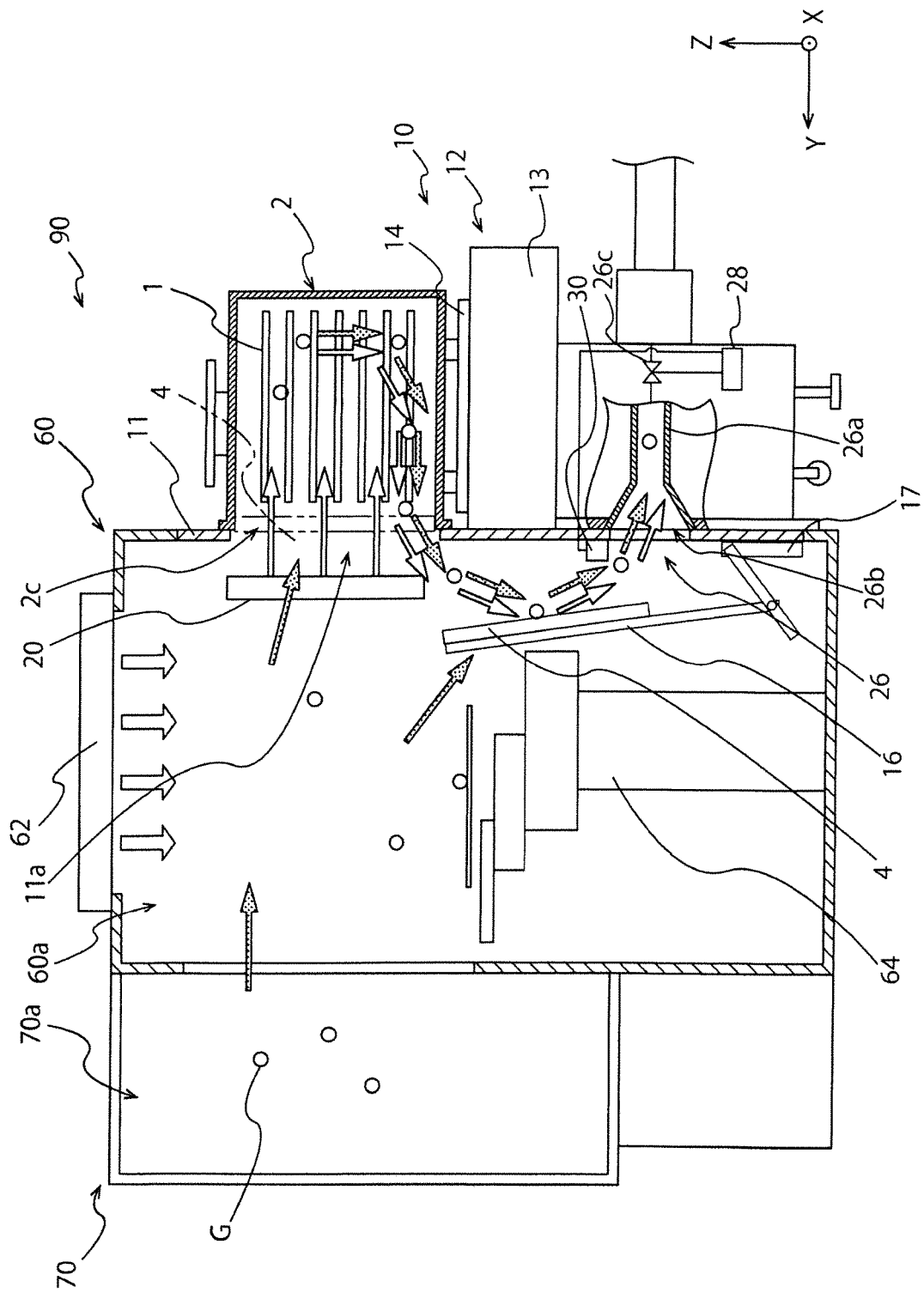
FIG. 1 is a schematic diagram illustrating a load port apparatus and a semiconductor manufacturing apparatus including the load port apparatus according to a first embodiment of the invention.

Hereinafter, the invention will be described on the basis of embodiments illustrated in the drawings.

FIG. 1 is a schematic diagram illustrating a semiconductor manufacturing apparatus 90 including a load port apparatus 10 according to a first embodiment of the invention. The semiconductor manufacturing apparatus 90 is provided with the load port apparatus 10 and includes an EFEM 60 in which a mini environment 60a is formed and a processing apparatus main body 70 which has a processing chamber 70a.

The EFEM 60 includes a fan filter unit (FFU) 62 and a transport robot 64. The pod 2 mounted on the load port apparatus 10 is connected to the mini environment 60a formed inside the EFEM 60 through a main opening 2c of the pod 2 and a frame opening 11a of the load port apparatus 10. A downward flow is formed by the fan filter unit 62 in the mini environment 60a, and thus, the inner space of the mini environment 60a is maintained in a highly clean state in comparison with a space outside the semiconductor manufacturing apparatus 90 in a semiconductor factory.

The transport robot 64 transports a wafer 1 as a housed object housed in the pod 2. The transport robot 64 transports the wafer 1 from the pod 2 through the mini environment 60a to the processing chamber 70a and transports the processed wafer 1 from the processing chamber 70a through the mini environment 60a to the pod 2. In addition, the housed object housed in the pod 2 is not limited to a silicon wafer used for manufacturing a semiconductor, but another material to be treated, such as another semiconductor substrate or a glass substrate used for manufacturing a liquid crystal panel are included.

The processing apparatus main body 70 including the processing chamber 70a is connected to the EFEM 60. The processing chamber 70a formed in the processing apparatus main body 70 is connected to the mini environment 60a formed in the EFEM 60. In the processing chamber 70a, various types of processing (such as semiconductor processing) are performed on the wafer 1 that passes through the mini environment 60a to be transported to the processing chamber 70a from the pod 2.

As illustrated in FIG. 1, the load port apparatus 10 provided so as to be a portion of the EFEM 60 includes a mounting unit 12 on which the pod 2 housing the wafer 1 is mounted, a frame portion 11 provided to stand adjacent to the mounting unit 12, and a door 16 for opening and closing a lid 4 for the pod 2 and the frame opening 11a which is formed in the frame portion 11. In the drawings, the Y axis is the moving direction of a movable table 14 in the mounting unit 12, the Z axis is the up/down direction as the vertical direction, and the X axis is the direction perpendicular to the Y axis and the Z axis.

The pod 2 is detachably mountable on the mounting unit 12 of the load port apparatus 10. As the pod 2, a FOPU and a FOSB may be exemplified. However, the pod 2 is not particularly limited, and another transport container for transporting the wafer 1 may be used as the pod 2.

The pod 2 includes a box-shaped casing having a main opening 2c formed on one of side surfaces and the lid 4 which closes the main opening 2c. The lid 4 is detachable to the main opening 2c, and as illustrated in FIG. 1, by opening the lid 4, the wafer 1 in the pod 2 can be drawn out, or the processed wafer 1 can be housed in the pod. In addition, by closing the main opening 2c of the pod 2 with the lid 4, the wafer 1 can be stored in the pod 2 in a sealed state, or the wafer 1 can be housed in the pod 2 in a sealed state, and the wafer 1 is transported.

The load port apparatus 10 is an interface apparatus for transferring the wafer 1 accommodated inside the pod 2 to the mini environment 60a and the processing chamber 70a while maintaining the clean state. As illustrated in FIG. 1, the door 16 of the load port apparatus 10 is engageable with the lid 4 of the pod 2. In addition, the load port apparatus 10 includes a door drive mechanism 17 that drives the door 16. The door drive mechanism 17 can perform movement of the door 16 and switching between engagement and disengagement of the door 16 and the lid 4. Although the door drive mechanism 17 is configured with a motor, an air cylinder, or the like which drives the door 16, the configuration of the door drive mechanism 17 is not particularly limited.

The frame portion 11 of the load port apparatus 10 constitutes a portion of the wall of the EFEM 60. The frame opening 11a is formed in the frame portion 11. The door 16 can be moved between a closed position (not illustrated) of closing the frame opening 11a and an opened position (refer to FIG. 1) of opening the frame opening 11a and connecting the inner space of the pod 2 and the mini environment 60a by being driven by the door drive mechanism 17.

The door 16 is engaged with the lid 4 of the pod 2 at the closed position and is moved between the closed position and the opened position together with the lid 4, so that the door 16 performs opening and closing the lid 4 as well as opening and closing the frame opening 11a. The opened position of the door 16 is set below the frame opening 11a so as not to disturb the transport of the wafer 1 by the transport robot 64. However, the opened position of the door 16 may be set to any position as long as the opened position does not disturb the transport of the wafer 1 by the transport robot 64.

The mounting unit 12 of the load port apparatus 10 includes a fixed base 13 and the movable table 14. The movable table 14 is provided on the fixed base 13, and the pod 2 is mounted on the movable table 14 by OHT or other transport means (not illustrated). The movable table 14 can reciprocate along the Y-axis direction. That is, the movable table 14 can be moved to a position away from the frame opening 11a from the state illustrated in FIG. 1, and when the movable table 14 is stopped at a position away from the frame opening 11a, the pod 2 is mounted. In addition, as illustrated in FIG. 1, as the movable table 14 approaches the frame portion 11, the lid 4 of the mounted pod 2 can be engaged with the door 16 that closes the frame opening 11a.

The load port apparatus 10 includes a front purge nozzle 20 that is arranged in the mini environment 60a and introduces a cleaning gas into the pod 2 from the inner space of the mini environment 60a. The front purge nozzle 20 is provided independently from the door 16. The front purge nozzle 20 according to the embodiment is provided on the inner side (the mini environment 60a side) of the frame portion 11 and on the outer peripheral side of the frame opening 11a (refer to FIG. 5).

The cleaning gas is supplied to the front purge nozzle 20 through a piping unit (not illustrated). As indicated by the outlined arrows in FIG. 1, the front purge nozzle 20 releases the cleaning gas towards the pod 2 from the inner space of the mini environment 60a to which the pod 2 is connected through the main opening 2c and the frame opening 11a. The cleaning gas released by the front purge nozzle 20 is introduced into the pod 2 through the main opening 2c and the frame opening 11a. As the cleaning gas discharged from the front purge nozzle 20, an inert gas such as CDA or nitrogen gas can be used, and nitrogen gas is preferably used, but the invention is not particularly limited thereto.

As illustrated in FIG. 1, the load port apparatus 10 includes an inner gas exhaust unit 26 that exhausts gas from the mini environment 60a to which the pod 2 is connected through the main opening 2c and the frame opening 11a. The inner gas exhaust unit 26 is provided inside the frame opening 11a and below the outer periphery of the frame opening 11a. The inner gas exhaust unit 26 includes an opening 26b opened to the mini environment 60a similarly to the frame opening 11a, an inner gas exhaust flow path 26a connected to the opening 26b to exhaust the gas of the mini environment 60a, and a valve 26c which switches the connection of the inner gas exhaust flow path 26a and an external pipe.

The inner gas exhaust unit 26 is preferably connected through the valve 26c to the external pipe such as an exhaust system of a semiconductor factory. Such an inner gas exhaust unit 26 can perform forced gas exhaust by suction or a pressure difference (negative pressure). In addition, the inner gas exhaust unit 26 may be capable of adjusting the exhaust capacity by changing the opening amount of the valve 26c or the like. The opening and closing of the valve 26c and the change of the opening amount are controlled by the control unit 28. However, the inner gas exhaust unit 26 is not limited to the one which forcibly exhausts a gas, but the inner gas exhaust unit 26 may be one which naturally exhausts the gas from the mini environment 60a.

In addition, in a state where the pod 2 is connected to the mini environment 60a through the main opening 2c and the frame opening 11a, the inner gas exhaust unit 26 can discharge the gas in the pod 2 as illustrated by parallel arrows in FIG. 1. In particular, the exhaust by the inner gas exhaust unit 26 is performed in parallel with the introduction of the cleaning gas to the pod 2 by the front purge nozzle 20, so that the gas pushed out from the pod 2 easily flows to the opening 26b of the inner gas exhaust unit 26, and the inner gas exhaust unit 26 can effectively exhaust the gas in the pod 2.

As illustrated in FIG. 1, the load port apparatus 10 includes a corrosive gas detection sensor 30 arranged between the frame opening 11a and the inner gas exhaust unit 26, that is, on the path through which the gas pushed out from the pod 2 is exhausted from the opening 26b of the inner gas exhaust unit 26. In the load port apparatus 10 according to the first embodiment, the corrosive gas detection sensor 30 is provided around the opening 26b of the inner gas exhaust unit 26 on an inner surface (a surface on the mini environment 60a side) of the load port apparatus 10. However, the arrangement of the corrosive gas detection sensor 30 is not limited to this, and the corrosive gas detection sensor 30 may be arranged at other positions between the main opening 2c of the pod 2 and the inner gas exhaust unit 26 or in the inner gas exhaust flow path 26a which is an exhaust flow path of the inner gas exhaust unit 26.

The corrosive gas detection sensor 30 is not particularly limited as long as the corrosive gas detection sensor 30 detects corrosive gas G. However, with respect to at least one of chlorine (Cl), bromine (Br), fluorine (F), potassium (K), hydrochloric acid (HCl), hydrogen bromide (HBr), ammonia ($NH_3$), sulfuric acid ($H_2SO_4$), and ions thereof (ammonium ion ($NH_4^+$), sulfate ion ($SO_4^{2-}$), and the like), the concentration (corrosive gas concentration) of the gas is preferably detected, and a chlorine gas sensor is particularly preferable.

The load port apparatus 10 includes a control unit 28 which controls the door drive mechanism 17, the movable table 14, the front purge nozzle 20, and the inner gas exhaust unit 26. By driving the door drive mechanism 17 and the movable table 14, the control unit 28 can control the movement of the door 16 and the pod 2 and can start or stop the release of the cleaning gas by the front purge nozzle 20 and the exhaust of gas by the inner gas exhaust unit 26.

In addition, information on the corrosive gas concentration which is the detection result of the corrosive gas detection sensor 30 is input to the control unit 28. Hereinafter, an example of a method of controlling the atmosphere in the pod 2 by the load port apparatus 10 will be described. For example, the control unit 28 detects the corrosive gas by the corrosive gas detection sensor in a state where the pod 2 is connected to the mini environment 60a through the main opening 2c and the frame opening 11a. As the corrosive gas G detected by the corrosive gas detection sensor 30, the gas flowing into the mini environment 60a from the processing chamber 70a, the gas generated as an outgas from the wafer 1 being transported in the mini environment 60a or the processed wafer 1 housed in the pod 2, or the like may be considered.

In addition, in a case where the corrosive gas concentration as a detection result by the corrosive gas detection sensor 30 is equal to or higher than a predetermined value, by increasing the release amount of the cleaning gas per unit time by the front purge nozzle 20 or increasing the exhaust amount of the gas per unit time by the inner gas exhaust unit 26, the control unit 28 can increase the discharge speed of the corrosive gas from the mini environment 60a or the pod 2.

In addition, after confirming that the detected corrosive gas concentration is lower than the predetermined value, the control unit 28 can control the door drive mechanism 17 so that the door 16 moves to close the frame opening 11a and the main opening 2c. In addition, in a case where the detected corrosive gas concentration is equal to or higher than the predetermined value, the control unit 28 can maintain the state in which the pod 2 is connected to the mini environment 60a through the main opening 2c and the frame opening 11a and can continue to release the cleaning gas by the front purge nozzle 20 until the corrosive gas concentration is lower than a predetermined value. Accordingly, the load port apparatus 10 can prevent the problem that the wafer 1 is sealed in the pod 2 in a state where the corrosive gas concentration is high and can prevent the problem that the wafer 1 in the pod 2 is damaged by the corrosive gas.

As described above, the load port apparatus 10 according to the first embodiment can detect the gas extracted from the inside of the pod 2 to substantially detect the corrosive gas concentration of the gas in the pod 2 or estimate the corrosive gas concentration of the gas in the pod 2. Therefore, by performing the cleaning process or the like according to the detection result of the corrosive gas concentration in the pod 2, the load port apparatus 10 can prevent the housed object and peripheral devices from being damaged by the corrosive gas. In addition, in a case where the load port apparatus 10 detects that the corrosive gas concentration in the pod 2 is low, the load port apparatus 10 contributes to the improvement of production efficiency by shortening the time of the cleaning process.

Second Embodiment

Figure 2:
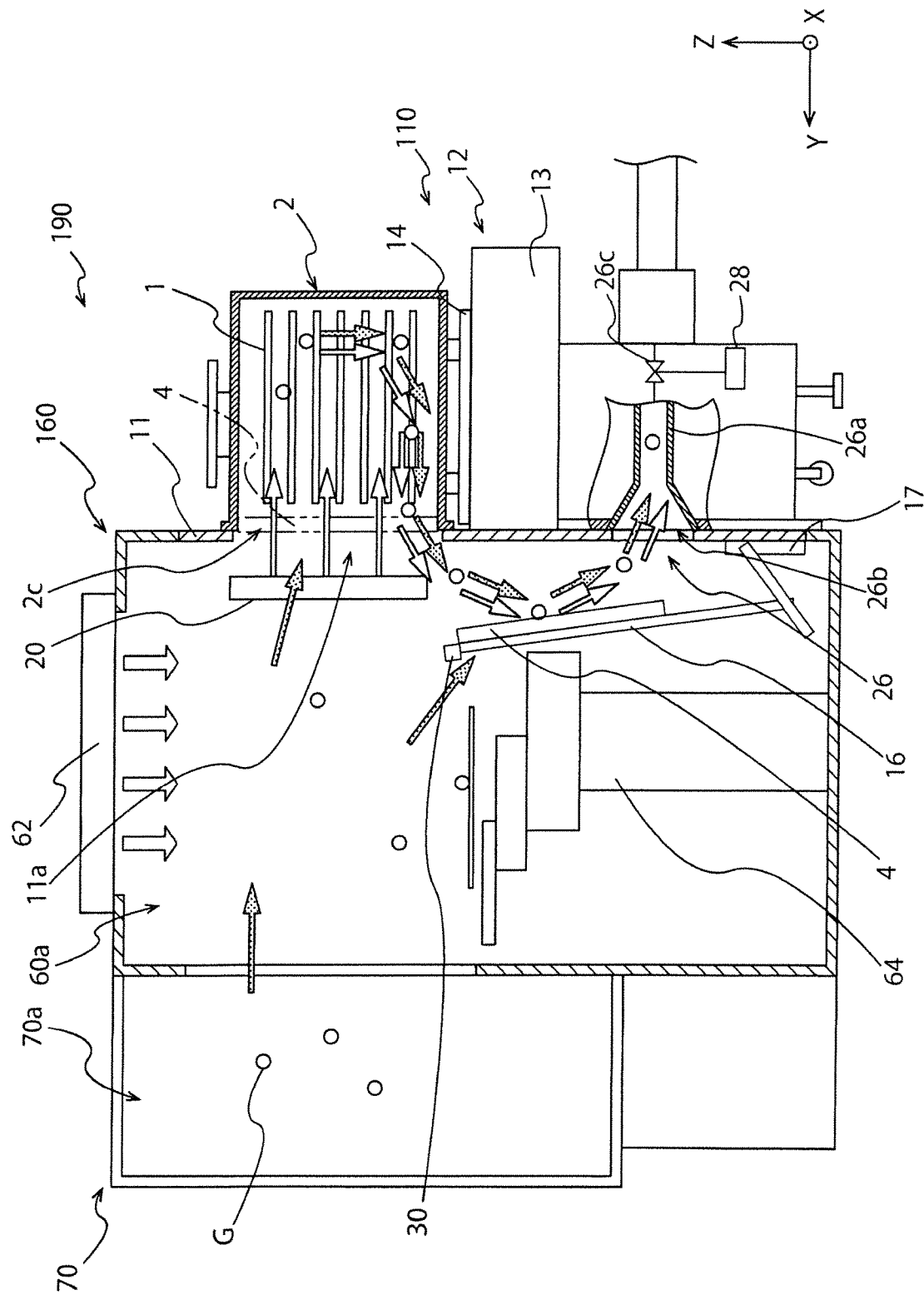
FIG. 2 is a schematic diagram illustrating a load port apparatus and a semiconductor manufacturing apparatus including the load port apparatus according to a second embodiment of the invention.

FIG. 2 is a schematic diagram illustrating a semiconductor manufacturing apparatus 190 including a load port apparatus 110 and an EFEM 160 according to a second embodiment of the invention. The semiconductor manufacturing apparatus 190 according to the second embodiment is the same as of the semiconductor manufacturing apparatus 90 according to the first embodiment except for the point that the arrangement of the corrosive gas detection sensor 30 in the load port apparatus 110 is different from that of the semiconductor manufacturing apparatus 90 illustrated in FIG. 1. Therefore, the only differences of the load port apparatus 110 and the semiconductor manufacturing apparatus 190 according to the second embodiment from the load port apparatus 10 and the semiconductor manufacturing apparatus 90 according to the first embodiment will be described, and the common points will be omitted in description.

As illustrated in FIG. 2, the corrosive gas detection sensor 30 of the load port apparatus 110 is attached to the top of the door 16. In the load port apparatus 110, the corrosive gas detection sensor 30 moves together with the door 16, and when the door 16 is positioned at the opened position, the corrosive gas detection sensor 30 is positioned between the frame opening 11a and the inner gas exhaust unit 26. Therefore, the corrosive gas detection sensor 30 illustrated in FIG. 2 can suitably detect the corrosive gas concentration in the pod 2 when the door 16 is positioned at the opened position. In addition, when the door 16 is positioned at the opened position, the corrosive gas detection sensor 30 attached to the top of the door 16 is positioned near the frame opening 11*a* to be easily in contact with the gas pushed out from the pod 2, so that the corrosive gas detection sensor 30 can more suitably detect the corrosive gas concentration in the pod 2.

In addition, the corrosive gas detection sensor 30 attached to the top of the door 16 does not disturb the movement of the door 16 or the loading and unloading of the wafer 1 to and from the pod 2 by the transport robot 64. Besides, the load port apparatus 110 and the semiconductor manufacturing apparatus 190 according to the second embodiment have the same effects as those of the load port apparatus 10 and the semiconductor manufacturing apparatus 90 according to the first embodiment.

Third Embodiment

Figure 3:
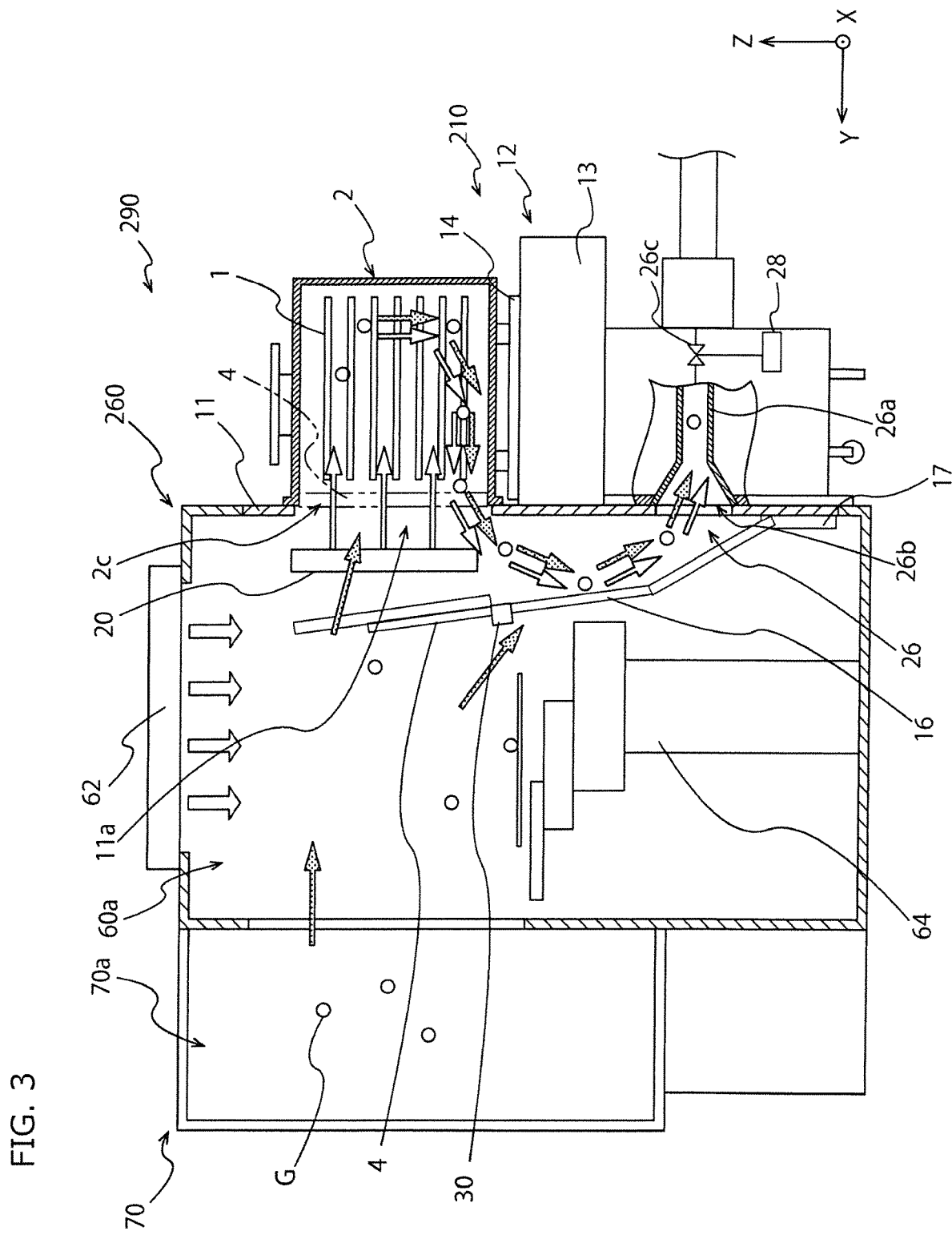
FIG. 3 is a schematic diagram illustrating a load port apparatus and a semiconductor manufacturing apparatus including the load port apparatus according to a third embodiment of the invention.

FIG. 3 is a schematic diagram illustrating a semiconductor manufacturing apparatus 290 including a load port apparatus 210 and an EFEM 260 according to a third embodiment of the invention. The semiconductor manufacturing apparatus 290 according to the third embodiment is the same as of the semiconductor manufacturing apparatus 90 according to the first embodiment except for the point that the arrangement of the corrosive gas detection sensor 30 in the load port apparatus 210 is different from that of the semiconductor manufacturing apparatus 90 illustrated in FIG. 1. Therefore, the only differences of the load port apparatus 210 and the semiconductor manufacturing apparatus 290 according to the third embodiment from the load port apparatus 10 and the semiconductor manufacturing apparatus 90 according to the first embodiment will be described, and the common points will be omitted in description.

As illustrated in FIG. 3, the corrosive gas detection sensor 30 of the load port apparatus 210 is attached to the lower portion of the door 16. In the load port apparatus 210, the corrosive gas detection sensor 30 moves together with the door 16, and when the door 16 is positioned at the measurement position between the opened position and the closed position, the corrosive gas detection sensor 30 is positioned between the frame opening 11*a* and the inner gas exhaust unit 26. Therefore, the corrosive gas detection sensor 30 illustrated in FIG. 3 can suitably detect the corrosive gas concentration in the pod 2 when the door 16 is positioned at the measurement position illustrated in FIG. 3.

For example, after the transport robot 64 completes the transport of the wafer 1, the control unit 28 of the load port apparatus 210 controls the door drive mechanism 17 to move the door 16 from the release position to the measurement position and allows the corrosive gas detection sensor 30 to perform the detection of corrosive gas. The measurement position of the door 16 is preferably a position that does not disturb the introduction of the cleaning gas into the pod 2 by the front purge nozzle 20 and the discharging of the gas from the pod 2 by the inner gas exhaust unit 26, and for example, when viewed from the X-axis direction, the measurement position of the door 16 can be set at such a position where the front purge nozzle 20 is interposed between the door 16 and the frame opening 11*a*. By arranging the door 16 in the measurement position as illustrated in FIG. 3, the cleaning gas released by the front purge nozzle 20 can be efficiently introduced into the pod 2.

In addition, the corrosive gas detection sensor 30 attached to the door 16 does not disturb the movement of the door 16 or the loading and unloading of the wafer 1 to and from the pod 2 by the transport robot 64. Besides, the load port apparatus 210 and the semiconductor manufacturing apparatus 290 according to the third embodiment have the same effects as those of the load port apparatus 10 and the semiconductor manufacturing apparatus 90 according to the first embodiment.

Fourth Embodiment

Figure 4:
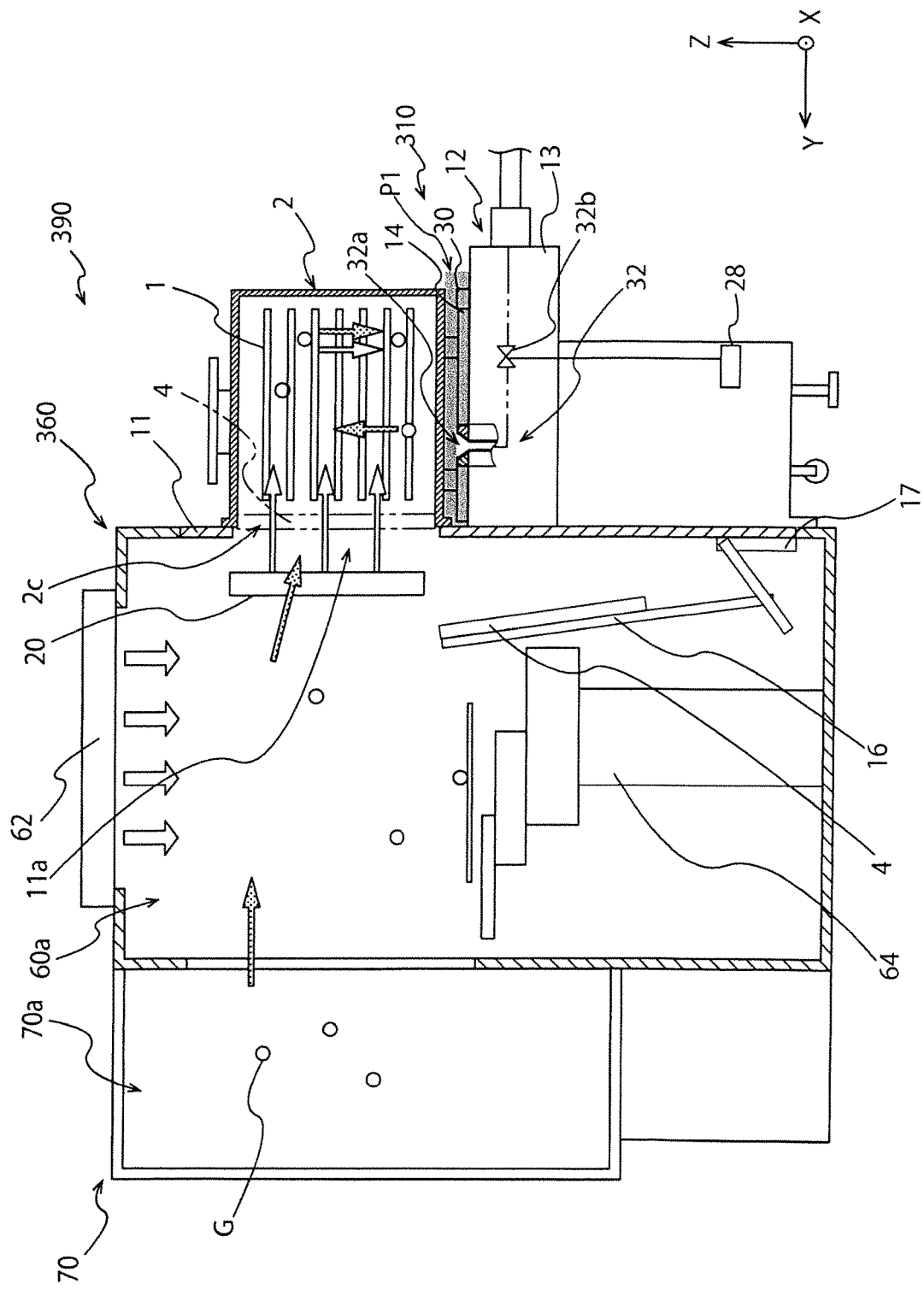
FIG. 4 is a schematic diagram illustrating a load port apparatus and a semiconductor manufacturing apparatus including the load port apparatus according to a fourth embodiment of the invention.

FIG. 4 is a schematic diagram illustrating a semiconductor manufacturing apparatus 390 including a load port apparatus 310 and an EFEM 360 according to a fourth embodiment of the invention. The semiconductor manufacturing apparatus 390 according to the fourth embodiment is the same as of the semiconductor manufacturing apparatus 90 according to the first embodiment except for the point that the arrangement of the corrosive gas detection sensor 30 in the load port apparatus 310 is different from that of the semiconductor manufacturing apparatus 90 illustrated in FIG. 1 and the point that a mounting-unit gas exhaust unit 32 as the outer gas exhaust unit is provided in place of the inner gas exhaust unit 26 illustrated in FIG. 1. Therefore, the only differences of the load port apparatus 310 and the semiconductor manufacturing apparatus 390 according to the fourth embodiment from the load port apparatus 10 and the semiconductor manufacturing apparatus 90 according to the first embodiment will be described, and the common points will be omitted in description.

As illustrated in FIG. 4, the corrosive gas detection sensor 30 of the load port apparatus 310 is arranged in the first space P1 below the pod 2 mounted on the mounting unit 12 and above the mounting unit 12. The corrosive gas detection sensor 30 arranged in the first space P1 detects the corrosive gas flowing out from the pod 2 to the outside (outside the mini environment 60*a* and the pod 2). The detection result by the corrosive gas detection sensor 30 is received by the control unit 28 of the load port apparatus 310.

As described in the first embodiment, the corrosive gas may be generated in the processing chamber 70*a*, the mini environment 60*a* and the pod 2. However, in some cases, the corrosive gas may flow out from the connection portion between the pod 2 and the frame portion 11. In some cases, in order to prevent the entry of gas from the outside and to increase the cleanliness, the inner space of the mini environment 60*a* may be set to a positive pressure in comparison with the outside and thus, the corrosive gas in the mini environment 60*a* and the pod 2 tends to easily flow out to the first space P1 along with the other gases. The corrosive gas detection sensor 30 arranged in the first space P1 detects such a corrosive gas.

The load port apparatus 310 illustrated in FIG. 4 includes a mounting-unit gas exhaust unit 32 for exhausting the gas in the first space P1. The mounting-unit gas exhaust unit 32 has an opening 32*a* opened on the upper surface of the mounting unit 12, and an exhaust flow path following the opening 32*a* is connected to the exhaust system of the semiconductor factory through a valve 32*b*. As a result, such a mounting-unit gas exhaust unit 32 can perform forced gas exhaust by suction or a pressure difference (negative pressure). In addition, the mounting-unit gas exhaust unit 32 may be capable of adjusting the exhaust capacity by changing the opening amount of the valve 32*b* or the like similarly to the inner gas exhaust unit 26.

The control unit 28 of the load port apparatus 310 can drive the valve 32*b* of the mounting-unit gas exhaust unit 32 to control the start and stop of the exhaust by the mounting-unit gas exhaust unit 32. For example, when the corrosive gas in the first space P1 is detected by the corrosive gas detection sensor 30, the control unit 28 drives the mounting-unit gas exhaust unit 32 to exhaust the corrosive gas from the first space P1. Accordingly, the load port apparatus 310 can prevent the constituent members of the mounting unit 12 and the like from being damaged by the corrosive gas.

In addition, when the corrosive gas in the first space P1 is detected by the corrosive gas detection sensor 30, the control unit 28 of the load port apparatus 310 may start or intensify the cleaning process in the pod 2 by increasing the release amount of the cleaning gas from the front purge nozzle 20 or the like. This is because it is considered that the outflow of the corrosive gas from the pod 2 is also related to the increase of the corrosive gas concentration in the pod 2. Accordingly, the load port apparatus 310 can prevent the corrosive gas concentration in the pod 2 from being excessively increased and can prevent the wafer 1 from being damaged by the corrosive gas.

Besides, the load port apparatus 310 and the semiconductor manufacturing apparatus 390 according to the fourth embodiment have the same effects as those of the load port apparatus 10 and the semiconductor manufacturing apparatus 90 according to the first embodiment.

Fifth Embodiment

Figure 5:
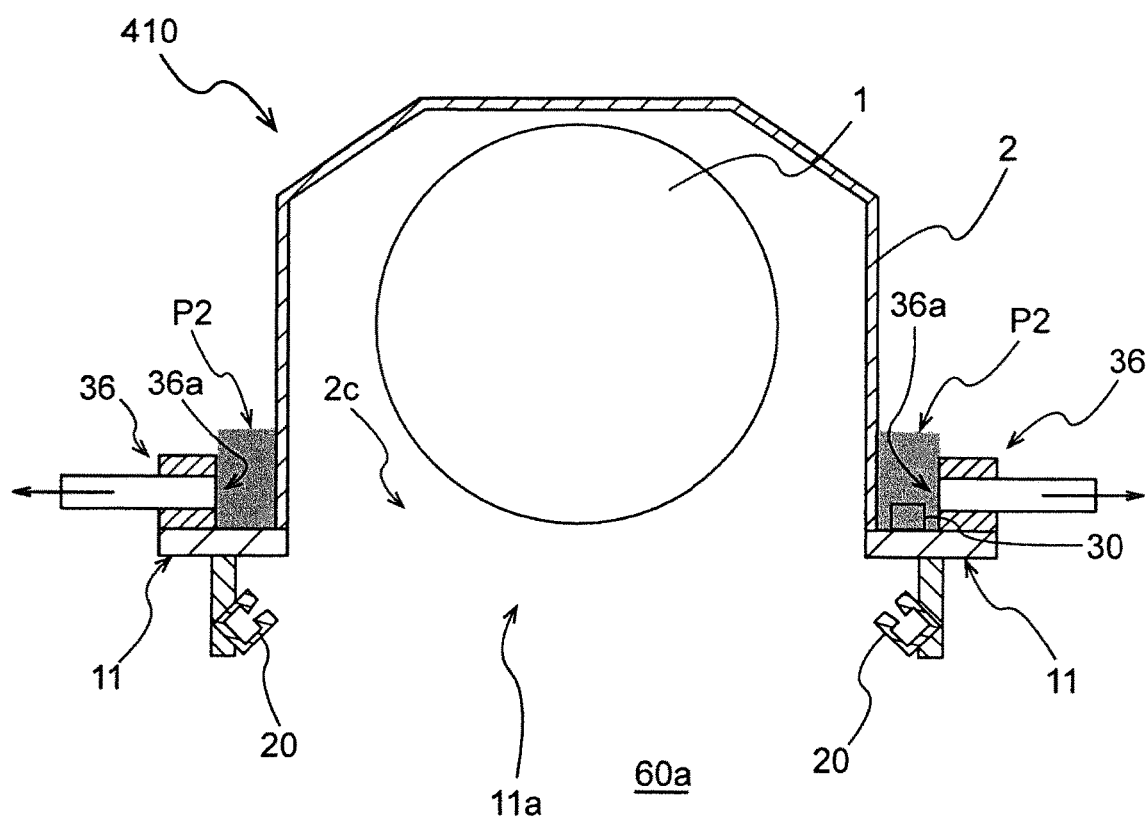
FIG. 5 is a cross-sectional diagram of main components viewed from the above of a load port apparatus according to a fifth embodiment of the invention.

FIG. 5 is a cross-sectional diagram of main components viewed from the above of a load port apparatus 410 according to a fifth embodiment of the invention. The load port apparatus 410 according to the fifth embodiment is the same as the load port apparatus 310 according to the fourth embodiment except for the point that the corrosive gas detection sensor 30 is arranged not in the first space P1 but in the second space P2 and that point that a frame-side gas exhaust unit 36 is provided as the outer gas exhaust unit in place of the mounting-unit gas exhaust unit 32. Therefore, the only difference of the load port apparatus 410 according to the fifth embodiment from the load port apparatus 310 according to the fourth embodiment will be described, and the common points will be omitted in description.

As illustrated in FIG. 5, the corrosive gas detection sensor 30 of the load port apparatus 410 is arranged in the second space P2 surrounding the outer periphery of the outer side of the frame opening 11a (a side opposite to the mini environment 60a which is the inner side). The corrosive gas detection sensor 30 of the load port apparatus 410 is attached to, for example, a side position of the frame opening 11a on an outer surface (a surface opposite to the mini environment 60a side) of the load port apparatus 410. Similarly to the corrosive gas detection sensor 30 according to the fourth embodiment, the corrosive gas detection sensor 30 arranged in the second space P2 detects the corrosive gas flowing out from the pod 2 to the outside (outside of the mini environment 60a and the pod 2). The detection result by the corrosive gas detection sensor 30 is input to the control unit 28 (refer to FIG. 4 or the like) of the load port apparatus 310.

The corrosive gas in the mini environment 60a or the pod 2 may flow out to the second space P2 together with other gases, and the corrosive gas detection sensor 30 arranged in the second space P2 detects such a corrosive gas.

The load port apparatus 410 illustrated in FIG. 5 includes a frame-side gas exhaust unit 36 that exhausts the gas in the second space P2. The frame-side gas exhaust unit 36 is provided on both sides of the pod 2 and has an opening 36a that is opened so as to face the connection portion between the pod 2 and the frame portion 11. In addition, the exhaust flow path following the opening 36a in the frame-side gas exhaust unit 36 is connected to the exhaust system of the semiconductor factory, and the frame-side gas exhaust unit 36 can perform forced gas exhaust by suction or a pressure difference (negative pressure). In addition, similarly to the inner gas exhaust unit 26, the frame-side gas exhaust unit 36 may be capable of adjusting the exhaust capacity by changing the opening amount of the valve or the like at the position of connection to the exhaust system under the control of the control unit 28. In addition, in the load port apparatus 410 illustrated in FIG. 5, the frame-side gas exhaust units 36 are installed at two positions, and the corrosive gas detection sensor 30 is installed at one position. However, the installation position and the installation number of the frame-side gas exhaust units 36 and the corrosive gas detection sensors 30 are not limited to these. For example, the installation position and the installation number may be one or three or more.

Similarly to the corrosive gas detection sensor 30 of the load port apparatus 310 illustrated in FIG. 4, the corrosive gas detection sensor 30 of the load port apparatus 410 is controlled by the control unit 28 of the load port apparatus 410.

Besides, the load port apparatus 410 according to the fifth embodiment has the same effects as those of the load port apparatus 310 according to the fourth embodiment. In addition, in the load port apparatuses 310 and 410 illustrated in FIGS. 4 and 5, the corrosive gas detection sensor 30 is arranged in only one of the first space P1 and the second space P2, but the load port apparatus according to the invention is not limited to this. The load port apparatus only needs to have the corrosive gas detection sensor 30 arranged in at least one of the first space P1 and the second space P2. For example, the corrosive gas detection sensor 30 may be arranged in both the first space P1 and the second space P2. In addition, the same applies to the outer gas exhaust unit.

Sixth Embodiment

Figure 6:
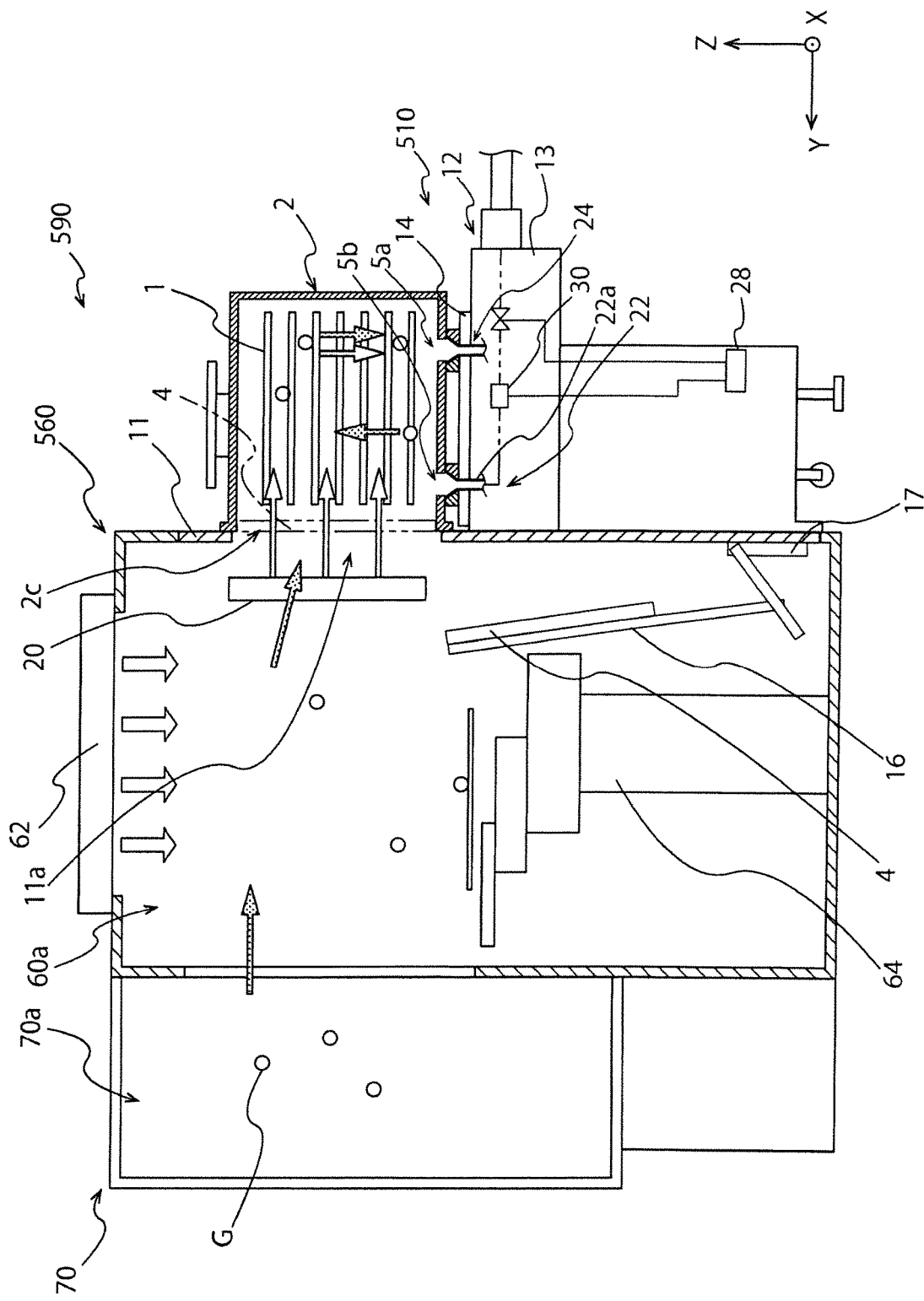
FIG. 6 is a schematic diagram illustrating a load port apparatus and a semiconductor manufacturing apparatus including the load port apparatus according to a sixth embodiment of the invention.

FIG. 6 is a schematic diagram illustrating a semiconductor manufacturing apparatus 590 including a load port apparatus 510 and an EFEM 560 according to a sixth embodiment of the invention. The semiconductor manufacturing apparatus 590 according to the fourth embodiment is the same as of the semiconductor manufacturing apparatus 90 according to the first embodiment except for the point that the arrangement of the corrosive gas detection sensor 30 in the load port apparatus 510 is different from that of the semiconductor manufacturing apparatus 90 illustrated in FIG. 1, the point that a bottom purge extraction nozzle 22 is provided in place of the inner gas exhaust unit 26 illustrated in FIG. 1, and the point that a bottom purge introduction nozzle 24 is provided. Therefore, the only differences of the load port apparatus 510 and the semiconductor manufacturing apparatus 590 according to the sixth embodiment from the load port apparatus 10 and the semiconductor manufacturing apparatus 90 according to the first embodiment will be described, and the common points will be omitted in description.

As illustrated in FIG. 6, the load port apparatus 510 includes a bottom purge extraction nozzle 22 which is connected to a bottom hole 5b of the pod 2 to discharge gas from the inside of the pod 2 and a bottom purge introduction nozzle 24 which is connected to a bottom hole 5a of the pod 2 to introducing a cleaning gas. The bottom purge extraction nozzle 22 and the bottom purge introduction nozzle 24 project upward from the movable table 14 in the mounting unit 12 and are connected to the bottom holes 5a and 5b provided in the bottom of the pod 2 mounted on the mounting unit 12.

An exhaust flow path 22a of the bottom purge extraction nozzle 22 is connected to the exhaust system of the semiconductor factory through a valve, and thus, the bottom purge extraction nozzle 22 can extract the gas in the pod 2. In addition, the cleaning gas is supplied from the cleaning gas tank (not illustrated) to the bottom purge introduction nozzle 24, and the bottom purge introduction nozzle 24 introduces the cleaning gas into the pod 2 from the bottom hole 5a of the pod 2.

The purge operation by the bottom purge extraction nozzle 22 and the bottom purge introduction nozzle 24 is controlled by the control unit 28 of the load port apparatus 510. The control unit 28 can operate the bottom purge extraction nozzle 22 and the bottom purge introduction nozzle 24 simultaneously but can operate only one of the bottom purge extraction nozzle 22 and the bottom purge introduction nozzle 24.

As illustrated in FIG. 6, the load port apparatus 510 includes a corrosive gas detection sensor 30 provided in the exhaust flow path 22a of the bottom purge extraction nozzle 22. The corrosive gas detection sensor 30 provided in the exhaust flow path 22a detects a corrosive gas contained in the gas in the pod 2 extracted by the bottom purge extraction nozzle 22. The detection result by the corrosive gas detection sensor 30 is input to the control unit 28 of the load port apparatus 510.

For example, in a case where the corrosive gas concentration detected by the corrosive gas detection sensor 30 is equal to or higher than a predetermined value, the control unit 28 of the load port apparatus 510 can continuously perform or start the introduction of the cleaning gas to the pod 2 by the front purge nozzle 20 or the bottom purge introduction nozzle 24. In addition, for example, after confirming that the detected corrosive gas concentration is lower than the predetermined value, the control unit of the load port apparatus 510 can end the cleaning of the pod 2 by the front purge nozzle 20 and the bottom purge introduction nozzle 24.

In this manner, the load port apparatus 510 can detect the gas extracted from the inside of the pod 2 through the bottom purge extraction nozzle 22 to detect the corrosive gas concentration of the gas in the pod 2. Therefore, by performing the cleaning process or the like according to the detection result of the corrosive gas concentration in the pod 2, the load port apparatus 510 can prevent the housed object and peripheral devices from being damaged by the corrosive gas. In addition, in a case where the load port apparatus 510 detects that the corrosive gas concentration in the pod 2 is low, the load port apparatus 510 contributes to the improvement of production efficiency by shortening the time of the cleaning process or the like.

Heretofore, although the invention has been described with reference to the embodiments, the invention is not limited to only these embodiments, and the invention includes many modified examples in which some of these embodiments are modified. For example, the load port apparatus according to the invention may include a plurality of the corrosive gas detection sensors 30 and a plurality of the corrosive gas discharging units and may include a mechanism as a combination of one embodiment and the corrosive gas detection system according to another embodiment.

In addition, the detection result by the corrosive gas detection sensor 30 may be sent to not only the control unit 28 of the load port apparatus 10 but also the control unit of the EFEM 60 or the semiconductor manufacturing apparatus 90 or a host computer that controls a plurality of semiconductor manufacturing apparatuses in the factory. The control unit and the host computer may control the circulation system such as the fan filter unit 62 and the exhaust system on the basis of the detection result by the corrosive gas detection sensor 30 or may perform an alert operation to the operator.

DESCRIPTION OF THE REFERENCE NUMERALS

1 . . . wafer
2 . . . pod
2c . . . main opening
4 . . . lid
5a,5b . . . bottom hole
11 . . . frame portion
11a . . . frame opening
10,110,210,310,410,510 . . . load port apparatus
12 . . . mounting unit
13 . . . fixed base
14 . . . movable table
16 . . . door
17 . . . door drive mechanism
P1 . . . first space
P2 . . . second space
20 . . . front purge nozzle
22 . . . bottom purge extraction nozzle
22a . . . exhaust flow path
24 . . . bottom purge introduction nozzle
26 . . . inner gas exhaust unit
26a . . . inner gas exhaust flow path
32 . . . mounting-unit gas exhaust unit
36 . . . frame-side gas exhaust unit
26b,32,36a . . . opening
26c,32b . . . valve
28 . . . control unit
30 . . . corrosive gas detection sensor
60,160,260,360,560 . . . EFEM
60a . . . mini environment
62 . . . fan filter unit (FFU)
64 . . . transport robot
70 . . . processing apparatus main body
70a . . . processing chamber
90,190,290,390,590 . . . semiconductor manufacturing apparatus

What is claimed is:

1. A load port apparatus comprising:
a mounting unit on which a pod housing a housed object is mounted;
a frame portion provided to stand adjacent to the mounting unit and having a frame opening to which a main opening of the pod is connected;
a door engageable with a lid for the main opening of the pod for opening and closing the frame opening and the main opening;
a door drive mechanism which drives the door; and
a corrosive gas detection sensor arranged in a first space outside of the pod and positioned below the pod and above the mounting unit or a second space outside of the pod and surrounding an outer periphery of an outer side of the frame opening.

2. The load port apparatus according to claim 1, further comprising an outer gas exhaust unit which exhausts gas of at least one of the first space and the second space.

* * * * *